US008164382B2

(12) United States Patent
Teplechuk (10) Patent No.: US 8,164,382 B2
(45) Date of Patent: *Apr. 24, 2012

(54) CONCEPT, METHOD AND APPARATUS OF IMPROVED DISTORTION SWITCHED-MODE AMPLIFIER

(75) Inventor: Mykhaylo Teplechuk, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/134,616

(22) Filed: Jun. 10, 2011

(65) Prior Publication Data

US 2011/0243352 A1    Oct. 6, 2011

Related U.S. Application Data (63) Continuation of application No. 12/583,254, filed on Aug. 17, 2009, now Pat. No. 7,965,138.

(30) Foreign Application Priority Data

Aug. 11, 2009  (EP) ..................................... 09368026

(51) Int. Cl.
H03F 3/38       (2006.01)
H03F 3/217      (2006.01)
(52) U.S. Cl. ................... 330/10; 330/251; 330/207 A
(58) Field of Classification Search .............. 330/10, 330/251, 207 A; 375/238; 455/127.3
See application file for complete search history.

(56) References Cited

U.S. PATENT DOCUMENTS

| 6,657,566 | B1 | 12/2003 | Risbo et al. |
| 6,998,910 | B2 * | 2/2006 | Hezar et al. ..................... 330/10 |
| 7,002,406 | B2 | 2/2006 | Risbo et al. |
| 7,102,405 | B2 | 9/2006 | Hisamoto et al. |
| 7,227,408 | B2 | 6/2007 | Candy |
| 7,301,393 | B2 | 11/2007 | Candy |
| 7,471,144 | B2 | 12/2008 | Lipcsei |
| 2007/0132509 | A1 | 6/2007 | Mochizuki |

FOREIGN PATENT DOCUMENTS

| JP | 2006191250 | 7/2006 |
| WO | WO 92/11699 | 7/1992 |
| WO | WO 2006/045147 | 5/2006 |

* cited by examiner

Primary Examiner — Robert Pascal
Assistant Examiner — Khiem Nguyen
(74) Attorney, Agent, or Firm — Saile Ackerman LLC; Stephen B. Ackerman (57) ABSTRACT Systems and methods for switched-mode amplifiers having improved harmonic distortion are disclosed. High order in-band filtering is enabled without undue trade-off of distortion due to intermodulation/aliasing. A pre-modulation block is introduced, deployed between a loop filter block and a pulse-width modulation block, performing uniform pulse-width modulation. The pre-modulation block attenuates/removes amplitude dependent high frequency ripples before pulse-width modulation. The pre-modulation block in conjunction with the pulse-width modulation block performs double sampling of the input signals.

18 Claims, 5 Drawing Sheets

CONCEPT, METHOD AND APPARATUS OF IMPROVED DISTORTION SWITCHED-MODE AMPLIFIER

This is a Continuation application of application Ser. No. 12/583,254, filed on Aug. 17, 2009, "Concept, method and apparatus of improved distortion switched-mode amplifier", now U.S. Pat. No. 7,965,138 assigned to the same assignee as the present invention, and which is herein incorporated by reference in its entirety.

BACKGROUND OF THE INVENTION (1) Field of the Invention

This invention relates generally to switched-mode amplifiers (Class-D amplifiers) and relates more specifically to switched-mode amplifiers having reduced distortion.

(2) Description of the Prior Art

Switched-mode amplifiers are often referred to "Class-D" amplifiers. Output of these types of amplifiers is a pulse-width (PWM) signal or a sigma-delta bit stream. Before applying such signal to a speaker load it is often filtered to remove or attenuate undesired high-frequency carrier frequency. Recently, filter-less switched systems have become popular. In filter-less architecture output of a switched-mode amplifier is often directly connected to a load.

Figure 1:
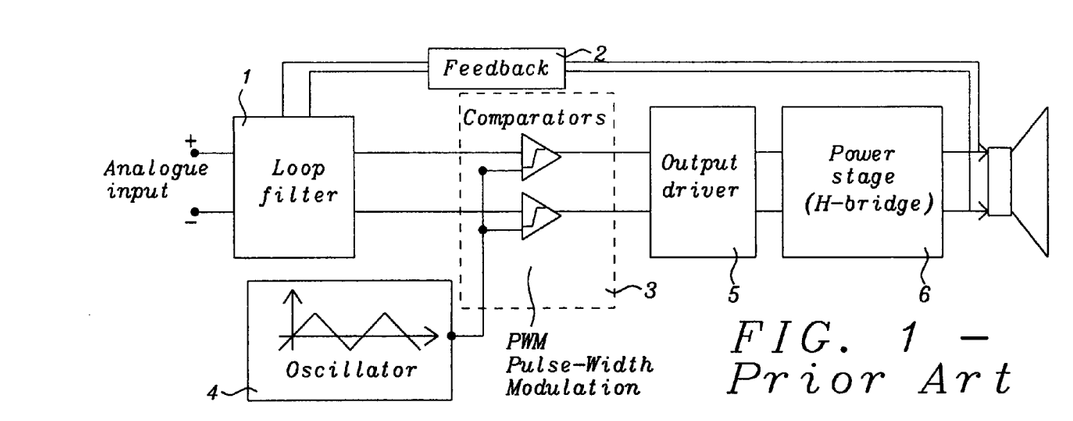
FIG. 1 prior art illustrates architecture of a prior art switched-mode amplifier of an audio application.

Typical prior-art switched-mode power amplifier architecture of an audio application is illustrated in FIG. 1 prior art (output filter is not shown). FIG. 1 prior art demonstrates that a typical switched-mode amplifier consists of: a loop filter 1, a feedback/gain block 2, a pulse-width modulation (PWM) block 3, an oscillator 4 (triangular wave generator), output drivers 5, and a power stage 6. The loop filter 1 integrates, e.g. audio signals and high-frequency pulse-width modulated output signals. In addition, the loop filter 1 is also required to attenuate residual high-frequency signals. The PWM block 3 converts the output signals from the loop filter 1 into pulse-width modulated (PWM) signals by comparing the loop filter output signals with the triangular wave signals from the oscillator 4. The output signals of the PWM block 3 are being applied to the output driver block 5 and to the power stage 6. The output driver 5 and power stage 6 blocks are required to provide a most efficient energy transfer from power source to the speaker load. Usually an output filter is used between the power stage 6 and an audio load. Typical efficiency requirement of these blocks is above 80%.

Such high efficiency is achieved by using output devices of the power stage 6 in switched-mode (full ON-OFF). The audio performance of such a switched mode system can be affected by distortion and noise performance of the output stage (power supply noise, switching artifacts; "dead time", finite rise/fall edges, etc). Therefore global negative feedback by feedback/gain block 2 is typically applied around the entire amplifier in order to minimize these unwanted effects.

An input loop filter is typically required to provide high open loop gain and attenuation of PWM carrier frequency. A high in-band open loop gain leads to improved distortion, noise and power supply rejection performance. High attenuation of the PWM carrier frequency is also desirable since residual high-frequency components (such as 2×f clock due to double transition at each switching period) present at the output of the loop filter can cause intermodulation (aliasing) with triangular wave signal/$f_{clk}$) and input audio signal. These unwanted intermodulation products are signal-dependent and can fold back into base-band and form harmonics of the input audio signal. These harmonics become distortion products of a switched-mode amplifier. Due to such intermodulation distortion performance of conventional switched mode amplifier is often limited by finite attenuation of residual carrier signals. Conventional switched-mode amplifier topologies require trade-off between high in-band loop gain and high attenuation of the clock carrier frequency. Typical prior art architectures exhibit limited distortion performance. High-order filters can be employed in order to provide additional attenuation of the carrier signal. However such approach often leads to increased complexity and often to reduction of stability margins of the system.

It is a challenge for the designers of switched-mode (class-D) amplifiers to design circuits wherein improved harmonic distortion, high attenuation of residual unwanted ripple signals without an undue reduction of stability margins and in-band open loop gain are achieved.

There are known patents or patent publications dealing with switched-mode amplifiers:

(U.S. Pat. No. 7,471,144 to Lipcsei) proposes a low distortion class-D amplifier comprising a power supply terminal for receiving power, an amplification stage, and an output stage. The amplification stage receives an input signal and generates a ramp signal.

(U.S. Pat. No. 7,301,393 to Candy) discloses an electronic class-D amplifier with intrinsically low distortion employing modulation of the slopes of a triangular-wave carrier reference signal. The amplifier includes a pulse width modulator, which includes an oscillator.

U.S. Patent Publication (US 2007/0132509 to Mochzuki) describes a class D amplifier that is capable of reducing distortion of a specific sampling frequency, and frequencies that are multiples of this frequency to a level where an LPF is not required and small-scale control circuit.

Furthermore (U.S. Pat. No. 7,002,406 to Risbo et al.) discloses a class-D amplifier circuit providing improved open-loop error for base-band frequencies, such as the audio band. The amplifier circuit includes a comparator for generating a pulse-width-modulated output signal that is applied to an output power stage. An LC filter is at the output of the power stage.

(U.S. Pat. No. 7,227,408 to Candy) teaches an electronic class-D amplifier including a pulse width modulator and a servo-loop amplifier characterized in that there is provided a sample and hold element which samples a signal at the sample input when a sample command signal is applied to a control input, and holds the value of the last sampled value of the signal at the sample input when a hold command signal is applied to the control input.

SUMMARY OF THE INVENTION

A principal object of the present invention is to achieve a switched-mode amplifier having an improved harmonic distortion performance.

A further object of the invention is to achieve a switched-mode amplifier having a high attenuation of residual unwanted ripple signals.

A further object of the invention is to achieve a switched-mode amplifier having no undue reduction of stability margins.

A further object of the invention is to achieve a switched-mode amplifier wherein high order in-band filtering is enabled without undue trade-off of distortion due to intermodulation/aliasing.

A further object of the invention is to achieve a switched-mode amplifier having an enhanced filter-less performance In accordance with the objects of this invention a method for a switched-mode amplifier having a high attenuation of unwanted residual ripple signals without requiring an output filter and without any reduction of stability margins has been achieved. The method invented comprises, firstly, the steps of (1) providing a switched-mode amplifier comprising a loop filter, a pre-modulation block, a PWM block, an oscillator, an output driver, and a power stage providing output for a load, (2) applying uniform pulse-width modulation to output signals of the loop filter, and (3) applying double sampling by the pre-modulation block in conjunction with the PWM block. The last step of the method invented is (4) attenuating residual clock signals without an output filter by transmission zero notches.

In accordance with the objects of this invention a switched-mode amplifier using uniform pulse-width modulation, having improved harmonic distortion performance, has been achieved. The switched-mode amplifier invented comprises, firstly, a loop filter, having inputs and an output, wherein a first input are analog signals, a second input are feedback signals from a power stage, and the output are signals, which have the analog input signals and said feedback signals integrated and filtered from residual high-frequency signals, a pre-modulation block, attenuating amplitude dependent high frequency ripples, having inputs and an output, wherein a first input is the output from said loop filter and a second input is an output from an oscillator, and the output is input to a pulse-width modulation block, and said pulse-width modulation block having inputs and an output, wherein a first input are the output signals from the pre-modulation block and a second input is an output from said oscillator, and the output of the pulse-width modulation block is the input of an output driver block, wherein the pulse-width modulation block performs double sampling in conjunction with the pre-modulation block. Furthermore the switched-mode amplifier invented comprises said oscillator wherein a first output is an input to the pre-modulation block and a second output is an input the pulse-width modulation block, said output driver block, wherein its output is the input of a power stage, and, finally, said power stage, wherein a first output are said feedback signals to the loop filter and a second output are amplified signals to a load.

BRIEF DESCRIPTION OF THE DRAWINGS

In the accompanying drawings forming a material part of this description, there is shown.

DESCRIPTION OF THE PREFERRED EMBODIMENTS

Circuits and methods for a switched-mode amplifier are disclosed. A preferred embodiment of the invention in regard of audio applications is presented.

It should be understood that the present invention could be successfully used in any high efficiency systems such as switched-mode power converters, motor control drivers, disk drivers, etc.

Figure 2:
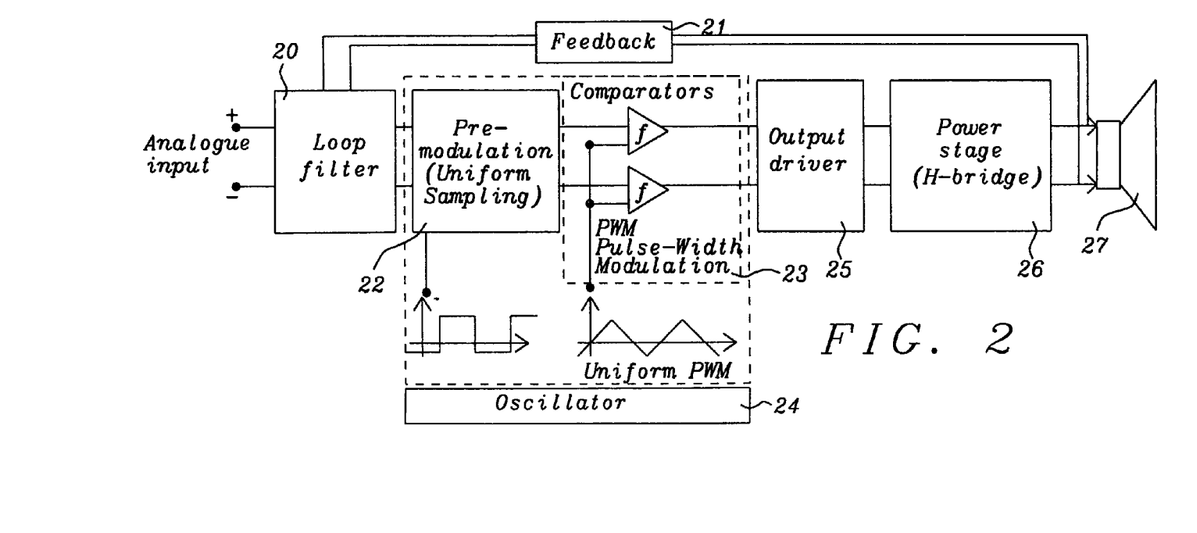
FIG. 2 shows switched-mode amplifier architecture of a preferred embodiment of the present invention.

FIG. 2 illustrates a preferred embodiment of switched-mode amplifier architecture of the present invention. The block diagram of FIG. 2 comprises a loop filter 20, a feedback/gain block 21, a pre-modulation block 22 performing uniform sampling, a pulse-width modulation (PWM) block 23, an oscillator 24, output driver 25, and a power stage 26 that could be an H-bridge. The oscillator 24 generates triangular wave signals and rectangular pulses with a duty cycle of 50% in a preferred embodiment. In the preferred embodiment of the present invention the output of the power stage 26 is directly delivered to a loudspeaker 27.

Presence or requirement for output filter depends only on the final application. Usually these output filters are passive LC filters. There are audio applications that do not use explicit output filter and there are applications that require output filter. PWM signals by their nature have much higher frequencies of operations typically well above audio band. Theoretically, in order to demodulate, extract audio content from such signals passive filters are required. In cases where no explicit output filter is used speaker load itself is used as a filter (hence filterless architecture). Present invention has no restriction on presence or requirement of output filters.

The main functional advantage of this pre-modulation block 22 is to perform uniform sampling and to remove/attenuate amplitude dependent high frequency ripple before the pulse-width modulation block 23. By pre-sampling this block 23 realizes a uniform pulse-width modulation (UPWM) concept. UPWM modulation is a process where signals are sampled uniformly at pre-defined time points (sample points are evenly spaced in time) before applying a pulse width modulation (PWM) process. Uniform pulse width modulation is achieved by taking a sample of the input signal (with undesired ripple) during a first half cycle of a system clock and holding this sample during a second half cycle of the system clock. Pre-sampling in conjunction with pulse-width modulation, performed in the pre-modulation block 22, effectively realizes a double-sampling system. The first sampling stage uniformly samples signals (with 50% duty cycle). The second stage is a conventional PWM stage that effectively samples (modulates) at crossover points of the triangular wave carrier and of the input signals. Alternatively other types of modulations could be used for the present invention as e.g. sigma-delta etc with same effect.

Figure 3:
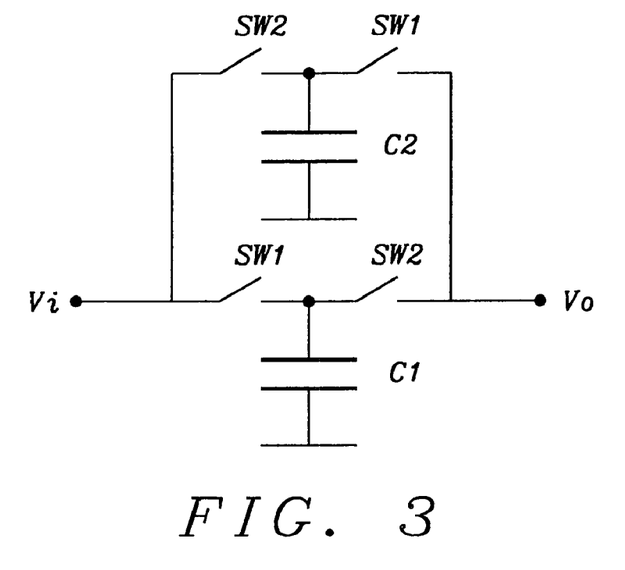
FIG. 3 shows a circuit diagram of a preferred embodiment of a pre-modulation block of the switched-mode amplifier invented.
Figure 4:
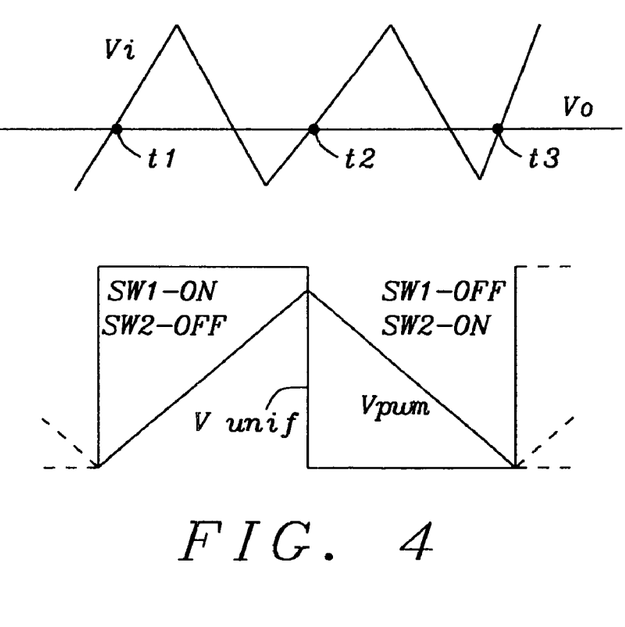
FIG. 4 illustrates a timing diagram of the pre-modulation block of the switched-mode amplifier invented.

A realization of the concept described above and the principle operation of the method invented can be explained by considering the simplified circuit diagram depicted in FIG. 3 and the timing diagram shown in FIG. 4.

FIG. 4 illustrates one cycle of operation showing uniform under-sampling, i.e. sampling with a frequency lower than residual high frequency ripples (and equal to main PWM frequency). The output signal (trace $V_i$) of the loop filter and input of the pre-modulation block 22 has a high frequency ripple at a frequency of $2\times f_{clk}$, superimposed on a reference signal. The trace $V_{unif}$ shows a rectangular 50% duty cycle sampling clock signal required by the pre-modulation block 22. The trace $V_{pwm}$ is a triangular wave signal also required by the pre-modulation block 22. Both pulses $V_{unif}$ and $V_{pwm}$ are generated by the oscillator 24.

A preferred operation can be explained by considering FIG. 3 and FIG. 4. At point of time $t_1$ (switch SW1 is ON and switch SW2 is OFF) input voltage $V_i$ is charging capacitor C1. At point of time $t_2$ (SW1 is OFF and SW2 is ON) input voltage $V_i$ is charging capacitor C2 and the charge previously stored on capacitor C1 is transferred to the output, This process is repeated at point of time $t_3$.

The output voltage of the pre-modulation block 22 is therefore formed by the charge stored on the two capacitors C1 and C2 during two halves of the switching period. Therefore it can be also seen the output voltage $V_o$ (FIG. 4) is linear and does not contain any unwanted high frequency ($2\times f_{clk}$) components present in the original input signal $V_i$. In a time domain this can be interpreted as an ideal filtering of a signal.

Therefore, by sampling- and holding of input voltage $V_i$ at original system clock frequency $f_{clk}$, it is possible to remove unwanted high frequency components from $V_i$.

In the preferred embodiment passive means, i.e. only capacitors and switches are used for the sample-and-hold circuit. However it should be noted that active means could also be used with the same effect.

In a frequency domain such operation is equivalent to a very deep "notch" (transmission zero) operation added to the system's transfer function. As a result this additional pre-modulation block provides the additional advantage of enabling a true filterless operation of a switched-mode amplifier.

It should be understood that not only the depth of the notch but also its width is important in practical operation. The depth of the notch will define attenuation level of unwanted signals while the notch width defines the bandwidth of attenuation of unwanted signals.

It is also important to note that the system proposed remains a pulse-width modulated system since the output of the pulse-width modulation block 23 is still supplied to the output drivers 25 and to the power stage 26.

During the transition time between $t_1$ and $t_2$ the triangular signal is rising from its minimum to its maximum level, assuming that the input reference signal of the pulse-width modulation block 22 (output of the pre-modulation block Vo) is bounded to these limits (min. max).

Since the two signals, input reference and triangular clock signal, are available at the input of the pulse-width modulation block 23, it will continue its normal operation. The PWM comparators will flip at cross points of the triangular wave and of the input reference signal. Two sampling events happen simultaneously during each half cycle of the system clock period. The first sampling event is, as described above, a pre-modulation sample-and-hold operation and the second sampling event is a pulse-width modulation. Since these two sampling events happen at the same time no extra delay will be introduced into the loop and system stability margins are therefore not degraded.

Furthermore it is important to note that in the present invention both over- and under-sampling can be used in the pre-modulation block 22 with the same effect. By under-sampling sampling a frequency lower than residual frequency ripple is used. It is also important to note that the same principle can be used with uniform over-sampling. Under sampling can be advantageous in many systems since the same frequency as the main PWM frequency can be used, i.e. sampling in the pre-modulation block 22 is performed with the same or lower frequency as the main clock frequency of PWM or Sigma-Delta blocks.

The advantages of the switched-mode amplifier invented are demonstrated by FIGS. 5-9.

Figure 5:
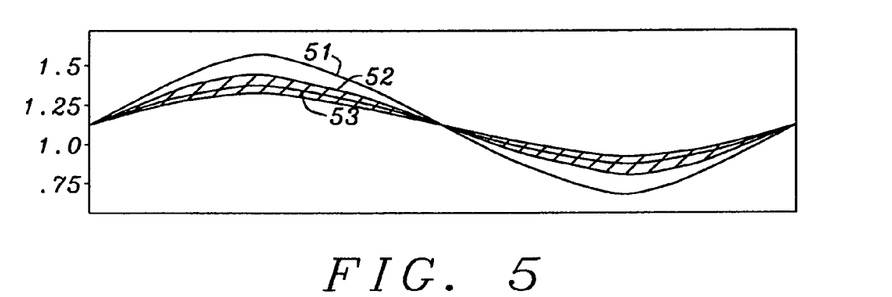
FIG. 5 demonstrates simulation results of the time domain behavior of a typical prior art system and the present invention.

FIG. 5 demonstrates simulation results of the time domain behavior of a typical prior art system and the system of the present invention. One cycle sinusoidal wave (audio), signified by numeral 51, is being applied to the input of both systems. Numeral 52 signifies a typical waveform of a prior art system with large ripple signal (signal before pulse-width modulation 3). Trace 53 demonstrates an input signal of the PWM block 23 of the architecture proposed. The advantage of the present invention is obvious by comparing traces 52 and 53. Trace 53 does not contain any unwanted high frequency ripple components as trace 52 does. Trace 54 is the output PWM signal that is fed back to the input of the loop filter 1.

FIG. 5 shows that in a typical prior art system, due to the finite attenuation at clock frequency, there is a large ripple present before PWM block 3 as shown in trace 52. It can also be observed that this ripple is signal dependent. The ripple signal of trace 52 is smaller for small input amplitudes and the ripple is higher for large amplitudes. Trace 53 demonstrates a filtered input of the PWM block 23 according to the present invention and trace 53 does not exhibit any signal dependencies.

Figure 6:
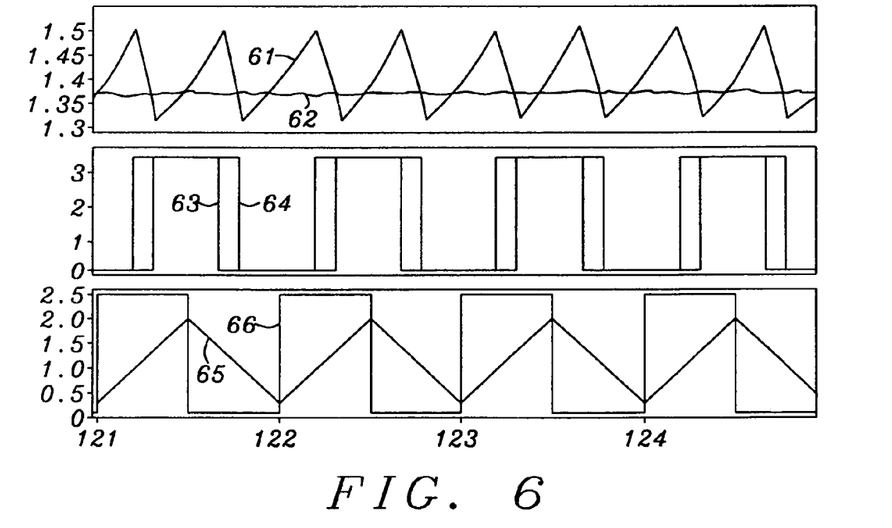
FIG. 6 shows detailed time domain responses of switched-mode amplifiers i.e. signals before PWM block. Related signals from prior art and the present invention are compared.

FIG. 6 demonstrates detailed time domain responses showing the advantages of the present invention. Trace 61 shows an input signal of the PWM block 3 (output of the loop filter 1) according typical prior art architecture. Trace 62 shows an output signal of the pre-modulation block 22 (input of the PWM block 23) according to the present invention. Traces 63 and 64 are output signals of the PWM block 3 demonstrating double transition with rise/fall edges creating ($2\times f_{clk}$) ripple signals as shown in trace 61 according to prior art. Traces 65 and 66 are clock waveforms supplied to PWM block 23 and pre-modulation 22 of the present invention. Other types of triangular clock signals could be used to provide effective pulse-width modulation as e.g. left/right aligned signals. It can be seen that trace 61 shows a large high frequency ripple signal ($2\times f_{clk}$) superimposed on the desired reference signal. At the same time trace 62 shows a clean reference signal without a high frequency ripple present.

Figure 7:
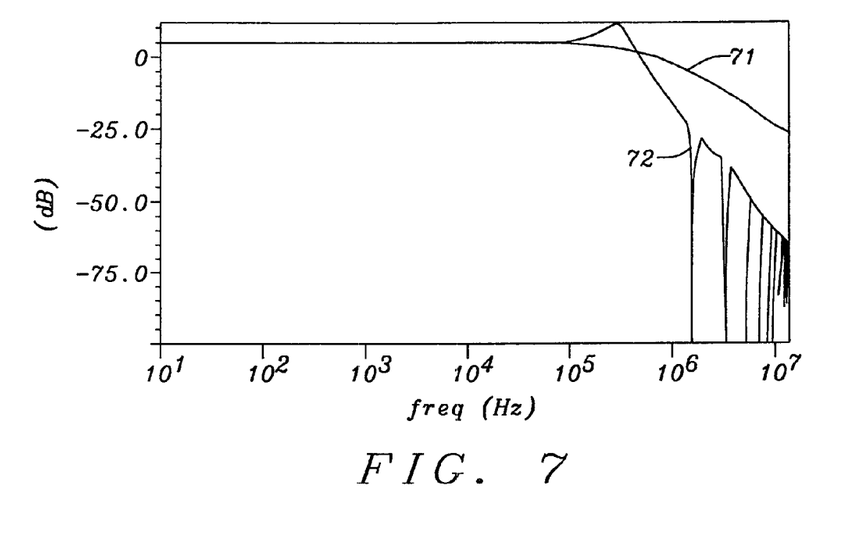
FIG. 7 shows frequency responses of switched mode amplifiers, comparing prior art with the present invention.
Figure 8:
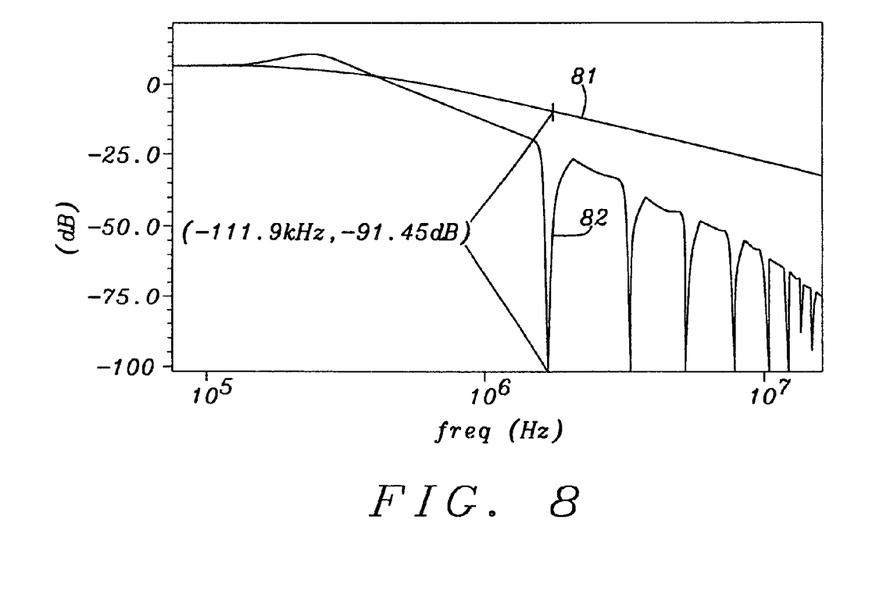
FIG. 8 shows detailed frequency responses of switched mode amplifiers, comparing prior art with the present invention.

FIG. 7 and FIG. 8 show comparisons of frequency domain behavior of typical prior art architecture (traces 71 and 81) with the present invention (traces 72 and 82). Deep transmission zero "notches" (at frequencies $2\times f_{clk}$, $4\times f_{clk}$ etc.) can be observed on the frequency response waveform of the present invention. The width of the transmission notches defines bandwidth of the attenuation of unwanted signals. In the examples of FIGS. 7 and 8 the clock frequency used is 1 MHz. FIG. 8 demonstrates a detailed view of the frequency responses shown in FIG. 7. Differences of attenuation levels at $2\times f_{clk}$ multiple frequencies between typical prior art frequency response and an embodiment of the present invention are higher than 90 dB as shown in FIG. 8. This example demonstrates that unwanted residual clocks (at multiples of $2\times f_{clk}$) will be attenuated (removed) by these very deep and wide transmission zero "notches". Similar attenuation levels can be achieved with a very high order filter. However, a practical system with such a high order filter would be difficult to be implemented due to degraded stability margins.

Figure 9:
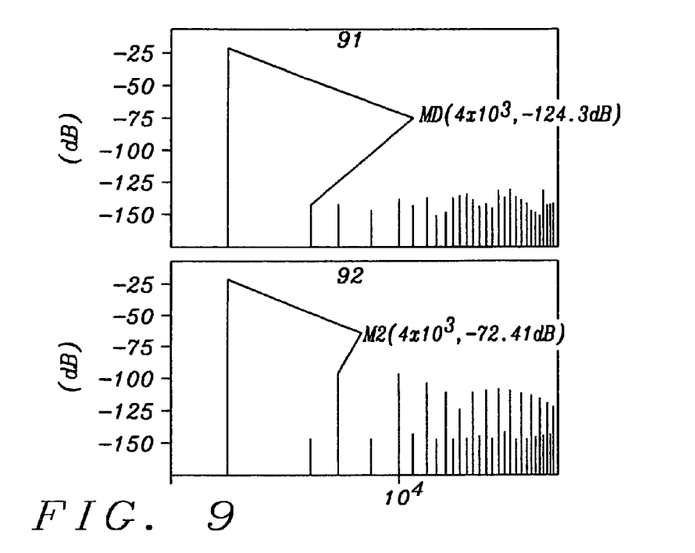
FIG. 9 shows spectrum contents of switched mode amplifiers, comparing prior art with the present invention.

FIG. 9 shows spectrum contents of switched mode amplifiers, comparing prior art with the present invention. FIG. 9 shows spectrum content of the signal present in the load audio signal of an audio application of switched-mode amplifiers.

Both sub-plots 91 and 92 of FIG. 9 demonstrate typical spectrums of the pulse-width modulated signals: peaks at a clock frequency ($f_{clk}$=1 MHz) and undesired residual ripple signals at multiples of $2 \times f_{clk}$. Subplot 91 shows a spectrum of the output signal of the present invention. Subplot 92 shows a spectrum of the output signal of typical prior art architecture. It can be observed that the output spectrum 92 of typical prior-art architecture demonstrates a high level of unwanted in-band harmonics (third order inter-modulation IM3@>−70 dB). An improved in-band distortion of the present invention can be observed from Subplot 91 of the present invention demonstrating a significant reduction of unwanted in-band distortion products (IM3@>−125 dB).

Figure 10:
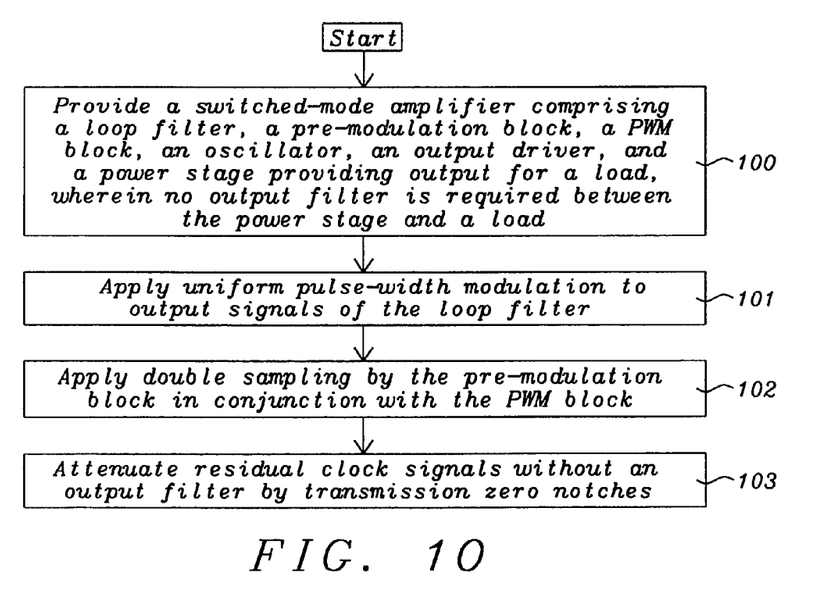
FIG. 10 illustrates a flowchart of a method invented for a switched-mode amplifier having a high attenuation of unwanted residual ripple signals without requiring an output filter and without any reduction of stability margins.

FIG. 10 illustrates a flowchart of a method invented for a switched-mode amplifier having a high attenuation of unwanted residual ripple signals without requiring an output filter and without any reduction of stability margins. A first step 100 describes the provision of a switched-mode amplifier comprising a loop filter, a pre-modulation block, a PWM block, an oscillator, an output driver, and a power stage providing output for a load, wherein no output filter is required between the power stage and a load. A next step 101 illustrates applying uniform pulse-width modulation to output signals of the loop filter. Step 102 describes applying double sampling by the pre-modulation block in conjunction with the PWM block. Step 103 discloses attenuating residual clock signals without an output filter by transmission zero notches.

It should be noted that prior art design of the entire closed loop of Class-D amplifiers requires a trade-off between higher open loop gain and attenuation at clock frequency. The open loop gain in prior art is mainly defined by high open loop gain of the loop filter block but also by a PWM stage contributing to open loop gain. Usually high in-band open loop gain is desirable since it leads to improved distortion and good power supply rejection performances. In typical prior-art systems attenuation at clock frequency is limited and therefore an increase of loop gain leads to a reduction of attenuation at clock frequency. A lower attenuation increases distortion in the system due to intermodulation effects. The open loop gain of the system can be increased by the loop filter itself or by the PWM modulation stage (PWM gain or comparator gain).

The present invention does not require this unnecessary trade-off between open loop gain and attenuation at clock frequency. Since clock frequency is attenuated by the uniform sampling block (uniform under-sampling, sample-and-hold block), the open loop gain of the system can be increased by increasing gain of the loop filter block or gain of PWM block (comparator gain, gain of the modulation stage) leading to an improved distortion performance. For example, a typically open loop gain increase by 6 dB will typically lead to a distortion improvement of 6 dB.

In summary, key items of the present invention are:
1. Use of uniform pulse-width modulation in switched-mode amplifiers.
2. Achieve a method of improving distortion of switched mode amplifiers.
3. Use of sample-and-hold circuit to implement uniform pulse width modulation in switched-mode amplifier architecture.
4. A true output filter-less switched mode amplifier, i.e. if required by special applications a high order output filter can be deployed.
5. Passive or active pulse-width sample-and-hold circuits to implement uniform pulse-width modulation.
6. Delay free double sampling switched-mode amplifier architecture.

While the invention has been particularly shown and described with reference to the preferred embodiments thereof, it will be understood by those skilled in the art that various changes in form and details may be made without departing from the spirit and scope of the invention.

What is claimed is:

1. A switched-mode amplifier using uniform pulse-width modulation, having improved harmonic distortion performance, comprises:
   a loop filter, having inputs and an output, wherein a first input are analog signals, a second input are feedback signals from a power stage via a feedback/gain block, and the output are signals, which have the analog input signals and said feedback signals integrated and filtered from residual high-frequency signals;
   said feedback/gain block minimizing distortion and noise performance of an power stage;
   a pre-modulation block, attenuating amplitude dependent high frequency ripples, having inputs and an output, wherein a first input is the output from said loop filter and a second input is an output from an oscillator, and the output is input to a pulse-width modulation block;
   said pulse-width modulation block having inputs and an output, wherein a first input are the output signals from the pre-modulation block and a second input is an output from said oscillator, and the output of the pulse-width modulation block is the input of an output driver block, wherein the pulse-width modulation block performs double sampling in conjunction with the pre-modulation block;
   said oscillator wherein a first output is an input to the pre-modulation block and a second output is an input the pulse-width modulation block;
   said output driver block, wherein its output is the input of the power stage; and
   said power stage, wherein a first output of the power stage is said feedback signals to the loop filter and a second output of the power stage are amplified signals to a load.

2. The switched-mode amplifier of claim 1 wherein said load is a loudspeaker.

3. The switched-mode amplifier of claim 1 wherein said pre-modulation block performs uniform pulse-width modulation.

4. The switched-mode amplifier of claim 1 wherein said first switching means is a sample-and hold circuit.

5. The switched-mode amplifier of claim 1 wherein said pre-modulation block comprises
   an input voltage, connected to a first terminal of a first switch of a first switching means and to a first terminal of a first switch of a second switching means;
   said first switching means; wherein a second terminal of said first switch of the first switching means is connected to a first terminal of a first capacitor and to a first terminal of a second switch of the second switching means, a first terminal of a second switch of the first switching means is connected to a first terminal of a second capacitor and to a second terminal of said first switch of a second switching means, and wherein a second terminal of the second switch of the first switching means is connected to an output voltage, and wherein both switches of the first switching means open and close simultaneously dependent upon signals from said oscillator;
   said second switching means; wherein a second terminal of said second switch of the second switching means is connected to the output voltage, and wherein both switches of the second switching means open and close simultaneously dependent upon signals from said oscillator;

said first capacitor, wherein its second terminal is connected to ground; and said second capacitor, wherein its second terminal is connected to ground.

6. The switched-mode amplifier of claim 5 wherein said first switching means is a sample-and hold circuit.

7. The switched-mode amplifier of claim 1 wherein said oscillator provides signals evenly spaced in time to the pre-modulation block.

8. The switched-mode amplifier of claim 7 wherein said oscillator provides rectangular pulses having a duty cycle of 50%.

9. The switched-mode amplifier of claim 1 wherein said pre-modulation block in conjunction with said pulse-width modulation block are performing double sampling.

10. The switched-mode amplifier of claim 1 wherein said pulse-width modulation block modulates at cross over points of a triangular wave carrier and an input signal.

11. The switched-mode amplifier of claim 10 wherein said triangular wave carrier is generated by said oscillator.

12. The switched-mode amplifier of claim 1 wherein under-sampling is used in the pre-modulation block.

13. The switched-mode amplifier of claim 1 wherein over-sampling is used in the pre-modulation block.

14. The switched-mode amplifier of claim 1 wherein unwanted clock frequency signals are attenuated by said pre-modulation block.

15. The switched-mode amplifier of claim 1 wherein an open loop gain of the system can be increased by increasing gain of the loop filter block.

16. The switched-mode amplifier of claim 1 wherein an open loop gain of the system can be increased by increasing gain of the pulse-modulation block.

17. The switched-mode amplifier of claim 1 wherein the switch-mode amplifier can be used in switched-mode power converters.

18. The switched-mode amplifier of claim 1 wherein the power stage is implemented as a H-bridge.

* * * * *